(12) United States Patent
Gao et al.

(10) Patent No.: US 6,689,677 B2
(45) Date of Patent: Feb. 10, 2004

(54) CMOS CIRCUIT OF GAAS/GE ON SI SUBSTRATE

(75) Inventors: Guang-Bo Gao, Cerritos, CA (US); Hoang Huy Hoang, Copertino, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/285,729

(22) Filed: Nov. 1, 2002

(65) Prior Publication Data

US 2003/0068849 A1 Apr. 10, 2003

Related U.S. Application Data

(62) Division of application No. 09/363,214, filed on Jul. 29, 1999, now Pat. No. 6,563,143.

(51) Int. Cl.[7] ................... H01L 21/28; H01L 21/3205
(52) U.S. Cl. ............... 438/602; 438/933; 438/935
(58) Field of Search ................... 438/602, 606, 438/622, 632, 933, 935

(56) References Cited

U.S. PATENT DOCUMENTS

| 4,183,134 A | 1/1980 | Oehler et al. ............ 148/187 |
| 4,478,655 A | 10/1984 | Nagakubo et al. ........ 148/175 |
| 4,749,662 A | 6/1988 | Custode ................. 437/58 |
| 4,774,205 A | 9/1988 | Choi et al. .............. 437/59 |
| 4,876,218 A | 10/1989 | Pessa et al. ............ 437/107 |
| 5,183,776 A | 2/1993 | Lee ..................... 437/110 |
| 5,302,840 A | 4/1994 | Takikawa ................ 257/194 |
| 6,567,213 B2 * | 5/2003 | Rosencwaig et al. | |
| 2002/0000584 A1 | 1/2002 | Eisenbeiser, et al. ...... 257/295 |
| 2002/0003238 A1 | 1/2002 | Ramdani, et al. ......... 257/190 |
| 2002/0003239 A1 | 1/2002 | Ramdani, et al. ......... 257/190 |

FOREIGN PATENT DOCUMENTS

| JP | 59-198750 | 11/1984 |
| JP | 62-54459 | 3/1987 |
| JP | 3-120752 | 5/1991 |

* cited by examiner

Primary Examiner—Phuc T. Dang
(74) Attorney, Agent, or Firm—Lisa K. Jorgenson; William A. Munck

(57) ABSTRACT

A GaAs/Ge on Si CMOS integrated circuit is formed to improve transistor switching (propagation) delay by taking advantage of the high electron mobility for GaAs in the N-channel device and the high hole mobility for Ge in the P-channel device. A semi-insulating (undoped) layer of GaAs is formed over a silicon base to provide a buffer layer eliminating the possibility of latch-up. GaAs and Ge wells are then formed over the semi-insulating GaAs layer, electrically isolated by standard thermal oxide and/or flowable oxide (HSQ). N-channel MOS devices and P-channel MOS devices are formed in the GaAs and Ge wells, respectively, and interconnected to form the integrated circuit. Gate electrodes for devices in both wells may be polysilicon, while the gate oxide is preferably gallium oxide for the N-channel devices and silicon dioxide for the P-channel devices. Minimum device feature sizes may be 0.5 $\mu$m to avoid hot carrier degradation while still achieving performance increases over 0.18 $\mu$m silicon-only CMOS integrated circuits.

27 Claims, 2 Drawing Sheets

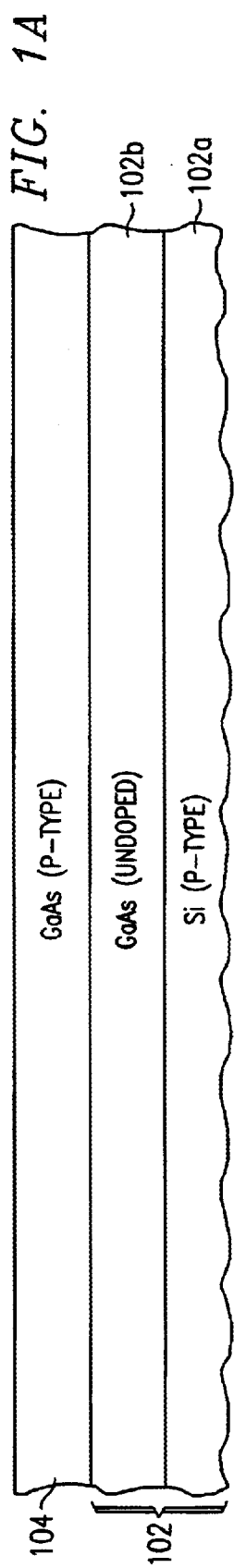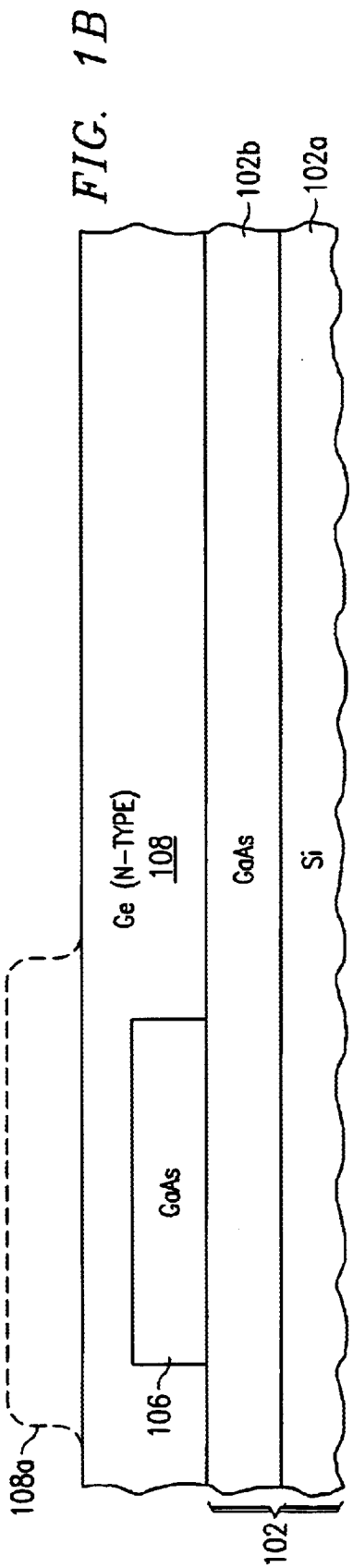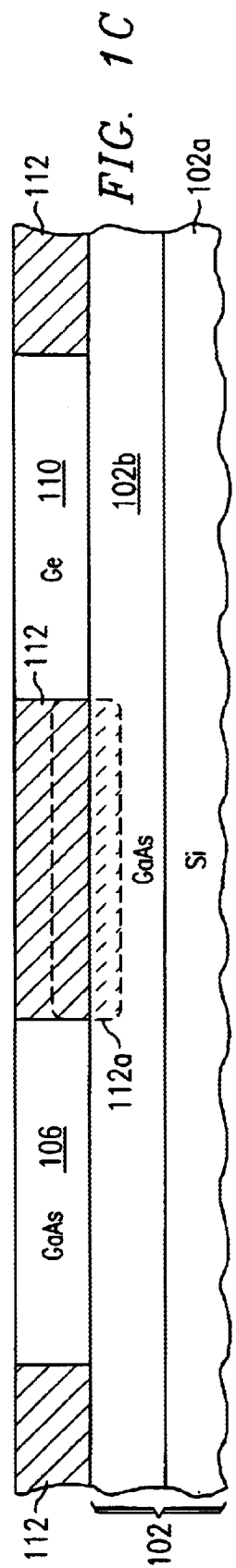

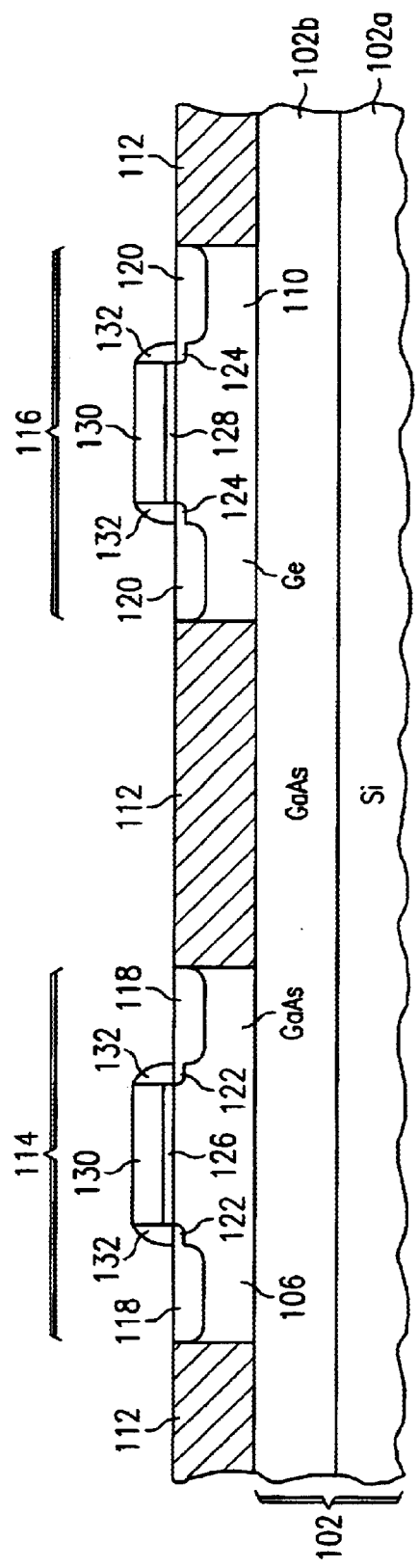
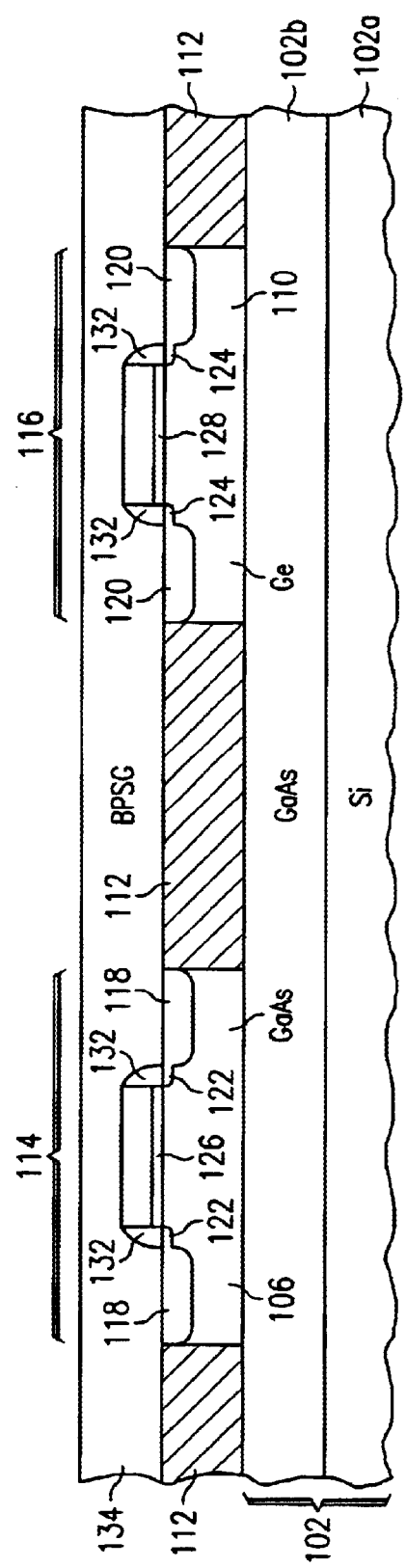
FIG. 1D
FIG. 1E

CMOS CIRCUIT OF GAAS/GE ON SI SUBSTRATE

This application claims priority as a division of U.S. patent application Ser. No. 09/363,214 filed Jul. 29, 1999 now U.S. Pat. No. 6,563,143.

BACKGROUND OF THE INVENTION

1. Field of the Invention

The present invention relates generally to integrated circuit device fabrication employing multiple semiconductor materials, and more specifically to integration of distinct semiconductor materials selected to optimize the speed of an integrated circuit including devices formed within each of the semiconductor materials.

2. Description of the Prior Art

Materials and device physics for commercial solid state semiconductor device fabrication have progressed through a wide spectrum of materials, material combinations, and device structures. Starting with the Germanium (Ge) point contact transistor in 1948, developments progressed in the 1950s through single-crystal Ge devices, Ge bipolar junction transistors (BJTs), Ge junction field effect transistors (JFETs), single crystal silicon (Si) devices, and silicon bipolar junction transistors. After development of silicon planar bipolar junction transistors and silicon metal oxide semiconductor field effect transistors (MOSFETs) in the early 1960s, together with Gallium Arsenide (GaAs) devices a few years later, progress on use of specific materials slowed until the latter half of the 1980s, with development of GaAs on Si devices and SiGe/Si heterojunction bipolar transistors (HBTs). In this decade, development of materials technology in semi-conductor device fabrication has progressed from GaAs on Si and SiGe/Si through GaAs metal semiconductor field effect transistors (MESFETs), Si complementary metal oxide semiconductor (CMOS) devices, SiGe/Si metal oxide semiconductor (MOS) devices, Aluminum Gallium Arsenide-Germanium-Gallium Arsenide (AlGaAs/Ge/GaAs) HBTs, and GaAs MOS devices.

For at least a decade, silicon MOS and CMOS technologies have been the mainstay of commercial semiconductor device fabrication, with advances in device feature size into the submicron range providing improvements in device performance. As very large scale integration (VLSI) technology pushes toward smaller geometries, however, the transistor channel length and the parasitic resistive-capacitive (RC) constant finally limit circuit speed. The transistor switching (propagation) delay $t_{pd}$ of a CMOS device, which is a function of the device load capacitance, the drain voltage, and the saturation currents for both the n-channel and p-channel devices, limit the maximum operating frequency for an integrated circuit device.

Improvement of performance in contemporary silicon MOS and CMOS processes through reduction of feature sizes, which are already less than 0.18 μm for CMOS channel lengths, is becoming increasingly difficult. Additionally, the electrical properties of silicon itself, particularly charge carrier mobility, are an increasingly significant limitation of device performance. For shorter device channel lengths, for example, carrier mobility ($\mu$, typically expressed in units of cm$^2$/V×sec) becomes an increasingly contributor to propagation delay. Accordingly, different combinations of semiconductor materials having different, beneficial electrical characteristics—such as SiGe—are currently being explored.

It would be desirable, therefore, to improve circuit speed in semiconductor integrated circuits, particularly through use of commercially viable materials and processing technology. It would further be advantageous to employ distinct semi-conductor materials to take advantage of the best electrical properties of different materials.

SUMMARY OF THE INVENTION

A GaAs/Ge on Si CMOS integrated circuit is formed to improve transistor switching (propagation) delay by taking advantage of the high electron mobility for GaAs in the N-channel device and the high hole mobility for Ge in the P-channel device. A semi-insulating (undoped) layer of GaAs is formed over a silicon base to provide a buffer layer, significantly lessening the possibility of latch-up. GaAs and Ge wells are then formed over the semi-insulating GaAs layer, electrically isolated by standard thermal oxide and/or flowable oxide (HSQ). N-channel MOS devices and P-channel MOS devices are formed in the GaAs and Ge wells, respectively, and interconnected to form the integrated circuit. Gate electrodes for devices in both wells may be polysilicon, while the gate oxide is preferably gallium oxide for the N-channel devices and silicon dioxide for the P-channel devices. Minimum device feature sizes may be 0.5 μm to avoid hot carrier degradation while still achieving performance increases over 0.18 μm silicon-only CMOS integrated circuits.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 1A–1E depict a series of cross-sections for a process of forming a GaAs/Ge on Si CMOS integrated circuit in accordance with a preferred embodiment of the present invention.

DESCRIPTION OF THE PREFERRED EMBODIMENT

The following description details the structure, application and features of the present invention, but it will be understood by those of skill in the art that the scope of the invention is defined only by the issued claims, and not by any description herein. The process steps and structures described below do not form a complete process flow for manufacturing integrated circuits. The present invention can be practiced in conjunction with common integrated circuit fabrication techniques, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

The present invention improves circuit speed by reducing propagation delay $t_{pd}$, which may be calculated for a typical CMOS ring oscillator from:

$$t_{pd} = 0.27 \cdot C_L V_{DD} \left( \frac{I_{dsatn} + I_{dsatp}}{I_{dsatn} I_{dsatp}} \right)$$

where $C_L$ is the load capacitance, $V_{DD}$ is the drain voltage, $I_{dsatn}$ is the N-channel transistor saturation current, and $I_{dsatp}$ is the P-channel transistor saturation current. Since $I_{dsatn}$ and $I_{dsatp}$ are proportional to the electron mobility $\mu_n$ and the hole mobility $\mu_p$, respectively, the above expression for transistor switching or propagation delay may be rewritten as:

$$t_{pd} = A\left(\frac{\mu_n + \mu_p}{\mu_n \mu_p}\right)$$

where A is a constant related to the doping level in the channels, the load capacitance, and the drain voltage.

It is well known that the speed of 0.18 μm Si CMOS integrated circuits is limited by the P-type MOS (PMOS) transistor. In order to overcome this limit, the present invention employs distinct semiconductor materials in the CMOS integrated circuit selected for electrical properties which optimize circuit speed. As used herein, "semiconductor material" refers to a chemical species of semiconductor, such as Si, Ge, or GaAs, as distinct from a "type" of semiconductor, which refers to the dopant type (i.e., N-type or P-type). Since propagation delay may be viewed as a function of electron and hole mobility, semiconductor materials are selected for the present invention which improve switching speed over silicon CMOS integrated circuits, where the improvement is characterized by a speed (improvement) factor S given by:

$$S = \left(\frac{t_{pd}(Si)}{t_{pd}(M)}\right)$$

where $t_{pd}(Si)$ is the propagation delay for a silicon CMOS integrated circuit and $t_{pd}(M)$ is the propagation delay for a similar CMOS integrated circuit employing the selected material(s) M. Table I below lists the electron and hole mobilities for different materials or material combinations which might be employed in a CMOS integrated circuit, together with the resulting speed improvement factor S.

TABLE I

| Material(s) | Mobility (drift) (cm²/V-s) | | Speed Improvement Factor |
| --- | --- | --- | --- |
| | $\mu_n$ | $\mu_p$ | (S) |
| Si | 1500 | 450 | 1 |
| Ge | 3900 | 1900 | 3.7 |
| GaAs | 8500 | 400 | 1.1 |
| Si/Ge | 1500 | 1900 | 2.4 |
| GaAs/Ge | 8500 | 1900 | 4.5 |

The mobility values $\mu_p$ and $\mu_p$ in Table I are taken from S. M. Sze, *Physics of Semiconductor Devices*, John Wiley & Sons (New York 1981). The values for speed improvement factor S in Table I are approximated from the mobility values, neglecting any material-specific differences for constant A.

It may be readily seen from Table I that the electron mobility of GaAs is higher than that of Si by more than 5 times, and the hole mobility of Ge is higher than that of Si by over 4 times. Since electrons are the majority charge carrier in NMOS devices while holes are the majority charge carrier in PMOS devices, the combination of GaAs-NMOS and Ge-PMOS will have the highest CMOS integrated circuit speed. Therefore, a novel CMOS integrated circuit structure utilizing GaAs/Ge CMOS on a Si substrate is employed in the present invention, optimizing circuit speed by employing GaAs for electron mobility and Ge for hole mobility. In a ring oscillator employing this GaAs/Ge on Si CMOS circuit, the propagation delay $t_{pd}$ is shorter than that of an ordinary Si CMOS circuit by a multiple of 3.5, meaning that 1.0 μm technology implemented in GaAs/Ge on Si can reach approximately the same performance as 0.25 μm technology implemented in silicon only.

With reference now to the figures, and in particular with reference to FIGS. 1A through 1E, a series of cross-sections for a process of forming a GaAs/Ge on Si CMOS integrated circuit in accordance with a preferred embodiment of the present invention are depicted. The process of the present invention begins with the structure shown in FIG. 1A, which includes a substrate 102. In the preferred embodiment, substrate 102 includes a silicon region 102a having a thickness of approximately 10–15 mils (roughly 250–400 μm), providing structural integrity and grounding for the CMOS circuit to be formed. Silicon region 102a may be doped with a P-type dopant, if desired. The dopant levels should be selected for the particular fabrication process(es) employed and device performance criteria sought in accordance with known techniques. Over the silicon region 102a is a semi-insulating gallium arsenide layer 102b having a thickness of less than 50,000 Å (5 μm), and more preferably in the range of 20,000 to 30,000 Å (2–3 μm). GaAs layer 102b may be undoped, and may be formed by metal organic chemical vapor deposition (MO CVD), molecular beam epitaxy (MBE) or other suitable process as appropriate. GaAs layer 102b provides a buffer layer on the Si region 102a, substantially eliminating the possibility of latch-up. Substrate 102, with a structure of the type described above (20,000–30,000 Å of undoped GaAs 102b on Si 102a), is commercially available.

An active GaAs layer 104 is formed on substrate 102. GaAs layer 104 preferably has a thickness of less than or equal to 2 μm, may be doped with a P-type dopant or dopants, and may be formed by chemical vapor deposition (CVD) or molecular beam epitaxy (MBE) in a manner similar to formation of GaAs layer 102b, or by other suitable process. GaAs layer 104 is then patterned and etched, utilizing conventional methods, to form a P-type GaAs well 106 as shown in FIG. 1B, in which NMOS devices will be formed. The high breakdown field of the GaAs reduces hot carrier degradation of NMOS devices formed within GaAs well 106. Again, the doping levels, and the particular methods employed for achieving the doping (e.g., during formation of the N and P wells, or after), may be selected from known parameters and techniques to achieve desired performance characteristics.

A Ge layer 108, doped with N-type dopants, is formed over the GaAs well 106 and GaAs buffer layer 102b to a thickness equal to or greater than the thickness of GaAs well 106. As with GaAs layer 104, Ge layer 108 may be formed by MO CVD or MBE processes; Ge layer 108 may also be formed by another CVD process or possibly by selective deposition or other suitable process. As illustrated by alternate profile 108a, Ge layer 108 may be formed as a conformal layer when deposited by MO CVD or MBE, then planarized, for example, by chemical-mechanical polishing (CMP). The planarization etch is preferably stopped when the upper surface of GaAs well 106 is exposed, and the thickness of the remaining Ge layer 108 is equal to the thickness of GaAs well 106. Preferably only a little, if any, of GaAs well 106 is removed in planarizing Ge layer 108. Ge layer 108 is patterned and etched, utilizing conventional methods, to form a Ge well 110, laterally spaced apart from GaAs well 106 on the surface of substrate 102 as shown in FIG. 1C, in which PMOS devices will be formed.

Isolation regions 112 are then formed between the GaAs well 106 and the Ge well 110, and between GaAs well 106 or Ge well 110 and adjacent regions (not shown), preferably through the use of flowable oxide (FOX), or hydrogen silsesquioxane (HSQ). The FOX is formed over the entire surface of the substrate, over GaAs well 106 and Ge well 110, and between and otherwise adjacent to GaAs well 106 and Ge well 110. The FOX is formed with a substantially planar upper surface, with a thickness greater than the thickness of GaAs well 106 and Ge well 110. The FOX is then etched back to expose the upper surfaces of GaAs well 106 and Ge well 110. Etch stop layers (not shown) may optionally be formed over GaAs well 106 and Ge well 110 prior to formation of the FOX, then removed after the FOX has been etched back to a desired thickness.

At least a portion 112a of any isolation oxide region 112 may optionally be a thermal oxide, a deposited oxide, or some other dielectric. For a thermal oxide portion 112a, the oxide may be grown after the formation of GaAs well 106 and Ge well 110 but before formation of an overlying FOX. Similarly, a deposited oxide or other deposited dielectric region may be deposited after formation of GaAs and Ge wells 106 and 110 but before formation of an overlying FOX layer. Isolation oxide may be formed of any number of dielectric layers and materials between and around GaAs and Ge wells 106 and 110. The combined thickness of such dielectric layers and materials is preferably less than the thickness of GaAs and Ge wells 106 and 110, and a FOX layer is preferably formed over all such dielectric layers and materials as described above, then etched back until the upper surface of isolation regions 112 are substantially planar with the upper surfaces of GaAs and Ge wells 106 and 110.

For a CMOS device, at least one NMOS device 114 is formed within GaAs well 106, and at least one PMOS device 116 is formed within Ge well 110, as shown in FIG. 1D. NMOS and PMOS devices 114 and 116 may both include conventionally formed source/drain regions 118, 120, formed, for example, by diffusion and/or implantation, and lightly doped source/drain regions 122, 124. Source/drain regions 118 and lightly doped source/drain regions 122 for NMOS device 114 are doped with N-type dopants, while source/drain regions 120 and lightly doped source/drain regions 124 for PMOS device 116 are doped with P-type dopants. NMOS device 114 includes a gate dielectric 126. The gate dielectric 126 for NMOS device 114 is preferably gallium oxide ($GaO_x$), which may be thermally grown or deposited to a thickness selected for desired device performance. PMOS device 116 includes a gate dielectric 128. The gate dielectric 128 for PMOS device 116 is preferably silicon dioxide ($SiO_2$), which may be formed by conventional methods (e.g., deposited) with a thickness selected for desired device performance. Gate electrodes 130 for both NMOS and PMOS devices 114 and 116 may be polysilicon, and sidewalls 132 for both devices may be conventional tetraethoxysilane (TEOS) dielectric sidewall structures or other appropriate materials.

In forming NMOS and PMOS devices 114 and 116, a minimum device feature size of 0.5 µm is preferably employed to avoid hot carrier degradation, although smaller feature size may be employed to improve device density and more efficiently utilize chip area. Due to improvements is speed, however, overall performance obtainable only with 0.18 µm minimum device feature sizes in silicon-only CMOS integrated circuits may be maintained with the present invention utilizing minimum feature sizes of 0.5 µm. Where performance degradation from hot carrier injection may be avoided, smaller feature sizes may be utilized in the present invention to further improve speed.

After NMOS and PMOS devices 114 and 116 have been formed, a layer or several layers of insulation or passivation material 134 such as borophosphosilicate glass (BPSG) is formed over the devices 114 and 116 as depicted in FIG. 1E, together with any other metallization, insulation, or passivation layers (not shown) which are required to form a complete integrated circuit. Although only one NMOS device 114 and one PMOS device 116 are shown in the exemplary embodiment as being formed within GaAs well 106 and Ge well 110, those skilled in the art will recognize that GaAs well 106 and Ge well 110 are elongate, shown only in cross-section, and may contain any number of NMOS or PMOS devices. These devices may be connected by interconnects within various metallization levels to form any integrated circuit.

Those skilled in the art will also recognize that variations in the order of portions of the process described above are possible. For example, NMOS device 114 may be formed within GaAs well 106 prior to formation of Ge layer 108. This would be especially useful if utilized to leave a Ge cover layer over the upper surface of NMOS source/drain regions 118, for making contact between source/drain regions 118 and overlying metallization (not shown). Together with a titanium/germanium contact, such a Ge cover layer could reduce Ohmic contact resistance and, in turn, further increase circuit speed.

The present invention reduces transistor propagation delay and improves integrated circuit speed by implementing CMOS circuits in a GaAs/Ge on Si structure, taking advantage of the electron mobility for GaAs and the hole mobility for Ge. A semi-insulating GaAs buffer layer between the silicon base of the substrate and the GaAs and Ge device wells substantially eliminates the possibility of latch-up. Flowable oxide or other insulating material between wells provides requisite lateral electrical isolation.

While the invention has been particularly shown and described with reference to a preferred embodiment, it will be understood by those skilled in the art that various changes in form and detail may be made therein without departing from the spirit and scope of the invention.

What is claimed is:

1. A structure for forming a CMOS integrated circuit, comprising:
   a gallium arsenide region on a substrate;
   a germanium region on the substrate; and
   a flowable oxide region over the substrate between the germanium region and the gallium arsenide region.

2. The structure of claim 1, wherein the gallium arsenide region and the germanium region both have an upper surface substantially planar with an upper surface of the flowable oxide region.

3. The structure of claim 2, wherein the gallium arsenide region and the germanium region have a thickness less than or equal to about 2 µm.

4. The structure of claim 1, wherein the substrate further comprises:
   a buffer layer on which the gallium arsenide region and the germanium region are formed.

5. The structure of claim 4, wherein the substrate further comprises:
   a silicon base on which the buffer layer is formed,
   wherein the buffer layer is a semi-insulating gallium arsenide layer.

6. The structure of claim 1, wherein the gallium arsenide region, the germanium region, and the flowable oxide region are approximately equal in thickness.

7. The structure of claim 1, further comprising:
a thermal oxide on the substrate between the gallium arsenide region and the germanuim region, wherein the flowable oxide overlies the thermal oxide region.

8. A CMOS integrated circuit, comprising:
a silicon substrate;
a semi-insulating buffer layer over the silicon substrate;
a gallium arsenide region on the semi-insulating buffer layer;
a germanium region on the semi-insulating buffer layer, the germanium region spaced apart from and electrically isolated from the gallium arsenide region;
at least one N-channel device in the gallium arsenide region; and
at least one P-channel device in the germanium region, the at least one N-channel device and the at least one P-channel device electrically connected to form a circuit.

9. The integrated circuit of claim 8, wherein the semi-insulating buffer layer comprises undoped gallium arsenide.

10. The integrated circuit of claim 8, further comprising:
flowable oxide regions over the silicon substrate between the gallium arsenide and germanium regions and between the gallium arsenide region or the germanium region and any adjacent region.

11. An integrated circuit structure, comprising:
a substrate comprising a first semiconductor material; a first well for N-channel devices formed on the substrate and comprising a second semiconductor material different than the first semi-conductor material;
a second well for P-channel devices formed on the substrate and comprising a third semiconductor material different than the first and second semiconductor materials; and
a flowable oxide region over the substrate between the first and second wells.

12. The integrated circuit structure of claim 11, wherein the substrate comprises silicon and undoped gallium arsenide over the silicon, the first well comprises P-type gallium arsenide, and the second well comprises N-type germanium.

13. A method of forming a CMOS integrated circuit, comprising:
forming a gallium arsenide region on a substrate;
forming a germanium region on the substrate; and
forming a flowable oxide region over the substrate between the germanium region and the gallium arsenide region.

14. The method of claim 13, further comprising:
forming the gallium arsenide region and the germanium region to both have an upper surface substantially planar with an upper surface of the flowable oxide region.

15. The method of claim 14, wherein the steps of forming the gallium arsenide region and forming the germanium region further comprise:
forming the gallium arsenide region and the germanium region to a thickness of less than or equal to about 2 $\mu$m.

16. The method of claim further comprising:
depositing a gallium arsenide layer on the substrate;
removing portions of the gallium arsenide layer, leaving the gallium arsenide region;
depositing a germanium layer on the substrate and over the gallium arsenide region; and removing portions of the germanium layer to leave the germanium region.

17. The method of claim 16, wherein the step of removing portions of the germanium layer to leave the germanium region further comprises:
removing portions of the germanium layer over the gallium arsenide region by chemical mechanical polishing.

18. The method of claim 13, further comprising:
forming a buffer layer on which the gallium arsenide region and the germanium region are formed.

19. The method of claim 18, wherein the step of forming a buffer layer on the substrate on which the gallium arsenide region and the germanium region are formed further comprises:
forming a semi-insulating gallium arsenide layer on a silicon base.

20. The method of claim 19, further comprising:
forming the gallium arsenide region, the germanium region, and the flowable oxide region to approximately a same thickness.

21. The method of claim 13, wherein the step of forming a flowable oxide region over the substrate between the gallium arsenide region and the germanium region further comprises:
depositing flowable oxide on the substrate and over the gallium arsenide region and the germanium region; and
etching the flowable oxide to expose upper surfaces of the gallium arsenide region and the germanium region.

22. The method of claim 13, wherein the step of forming a flowable oxide region over the substrate between the gallium arsenide region and the germanium region further comprises:
growing a thermal oxide on the substrate between the gallium arsenide region and the germanium region;
depositing a flowable oxide over the thermal oxide, the gallium arsenide region, and the germanium region; and
etching the flowable oxide to expose upper surfaces of the gallium arsenide region and the germanium region.

23. A method of forming a CMOS integrated circuit, comprising:
forming a semi-insulating buffer layer over the silicon substrate;
forming a gallium arsenide region on the semi-insulating buffer layer;
forming a germanium region on the semi-insulating buffer layer, the germanium region spaced apart from and electrically isolated from the gallium arsenide region;
forming at least one N-channel device in the gallium arsenide region; and
forming at least one P-channel device in the germanium region, the at least one N-channel device and the at least one P-channel device electrically connected to form a circuit.

24. The method of claim 23, wherein the step of forming a semi-insulating buffer layer over the silicon substrate further comprises:
forming undoped gallium arsenide layer over the silicon substrate.

25. The method of claim 23, further comprising:
forming flowable oxide regions over the silicon substrate between the gallium arsenide and germanium regions and between the gallium arsenide region or the germanium region and any adjacent region.

26. A method of forming an integrated circuit structure, comprising:
- providing a substrate comprising a first semiconductor material;
- forming a first well for N-channel devices formed on the substrate and comprising a second semiconductor material different than the first semi-conductor material;
- forming a second well for P-channel devices formed on the substrate and comprising a third semiconductor material different than the first and second semiconductor materials; and
- forming a flowable oxide region over the substrate between the first and second wells.

27. The method of claim 26, wherein the substrate comprises silicon and undoped gallium arsenide over the silicon, the first well comprises P-type gallium arsenide, and the second well comprises N-type germanium.

* * * * *